(12) United States Patent
Proebsting

(10) Patent No.: US 6,307,417 B1
(45) Date of Patent: Oct. 23, 2001

(54) INTEGRATED CIRCUIT OUTPUT BUFFERS HAVING REDUCED POWER CONSUMPTION REQUIREMENTS AND METHODS OF OPERATING SAME

(76) Inventor: Robert J. Proebsting, 13737 Wallace Pl., Morgan Hill, CA (US) 95037

( * ) Notice: Subject to any disclaimer, the term of this patent is extended or adjusted under 35 U.S.C. 154(b) by 0 days.

(21) Appl. No.: 09/602,330

(22) Filed: Jun. 23, 2000

Related U.S. Application Data

(60) Provisional application No. 60/150,430, filed on Aug. 24, 1999.

(51) Int. Cl.[7] ................................................. H03K 3/01
(52) U.S. Cl. .......................... 327/277; 327/270; 327/281
(58) Field of Search ................................... 327/388, 389, 327/390, 392, 393, 276, 277, 281; 326/82, 83, 88, 63

(56) References Cited

U.S. PATENT DOCUMENTS

| | | | |
|---|---|---|---|
| 4,122,361 | 10/1978 | Clemen et al. | 327/250 |
| 4,618,788 | 10/1986 | Backes et al. | 327/277 |
| 4,651,270 | 3/1987 | Edwards | 363/96 |
| 4,723,108 | * 2/1988 | Murphy et al. | 323/315 |
| 4,894,621 | * 1/1990 | Koenig et al. | 330/251 |
| 4,914,326 | 4/1990 | Kikuda et al. | 327/288 |
| 5,051,630 | 9/1991 | Kogan et al. | 327/262 |
| 5,057,722 | 10/1991 | Kobotake | 327/288 |
| 5,068,553 | 11/1991 | Love | 327/262 |
| 5,424,656 | * 6/1995 | Gibson et al. | 326/63 |
| 5,598,111 | 1/1997 | Enomoto | 326/83 |
| 5,610,546 | 3/1997 | Carbou et al. | 327/261 |
| 5,767,719 | 6/1998 | Furuchi et al. | 327/281 |
| 5,793,238 | 8/1998 | Baker | 327/262 |
| 5,801,567 | 9/1998 | Kosiec | 327/263 |
| 5,815,009 | 9/1998 | Iadanza et al. | 327/5 |
| 5,917,289 | * 6/1999 | Nerone et al. | 315/209 R |
| 5,920,221 | 7/1999 | Shen et al. | 327/264 |
| 5,929,692 | * 7/1999 | Carsten | 327/531 |
| 5,982,214 | 11/1999 | Kim | 327/280 |

OTHER PUBLICATIONS

Xie et al., "An Approach for Fabricating High–Performance Inductors on Low–Resistivity Substrates," IEEE Journal of Solid–State Circuits, vol. 33, No. 9, Sep., 1998, pp. 1433–1438.

* cited by examiner

Primary Examiner—Tuan T. Lam
Assistant Examiner—Hiep Nguyen
(74) Attorney, Agent, or Firm—Myers Bigel Sibley & Sajovec

(57) ABSTRACT

Integrated circuit output buffers include an integrated circuit substrate, an output buffer in the substrate which drives a respective load, a supplemental voltage supply pad on the substrate, a first switch and at least one external capacitor which is electrically coupled to the supplemental voltage supply pad. The first switch is electrically coupled in series between an output of the output buffer and the supplemental voltage supply pad. During operation, the first switch is closed to facilitate the forward transfer of stored charge from the at least one external capacitor (e.g., 1 $\mu$F) to a capacitive load (e.g., 100 pF) during a first portion of a pull-up time interval. The output buffer is then turned on to complete the pull-up operation. Next, the transferred charge is recycled back from the load into the external capacitor by closing the first switch again during a first portion of a pull-down time interval. The output buffer is then turned on to complete the pull-down operation. By recycling at least some of the charge used to drive the capacitive load, the amount of current required by the output buffer during a complete pull-up/pull-down cycle can be reduced.

33 Claims, 7 Drawing Sheets

INTEGRATED CIRCUIT OUTPUT BUFFERS HAVING REDUCED POWER CONSUMPTION REQUIREMENTS AND METHODS OF OPERATING SAME

This application claims benefit of Prov. No. 60/150,430 filed Aug. 24, 1999.

FIELD OF THE INVENTION

The present invention relates to integrated circuit devices, and more particularly to digital integrated circuit devices having output buffers therein for driving capacitive loads and methods of operating same.

BACKGROUND OF THE INVENTION

CMOS integrated circuits typically include inverting buffer circuits therein for driving on-chip and off-chip loads. As illustrated by FIG. 1, a conventional CMOS inverting buffer circuit includes a PMOS pull-up transistor T1 and an NMOS pull-down transistor T2 which are electrically connected in series between a power supply voltage (Vcc) and a ground or negative reference voltage (Vss).

Unfortunately, although the buffer circuit of FIG. 1 can be designed to switch at relatively high speeds, it requires a large amount current from its power supply when switching a capacitive load $C_L$ from Vss to Vcc and then back to Vss. For example, a large total charge $Q=C_L(Vcc)$ is required from the power supply to switch each capacitive load $C_L$ through an entire pull-up and pull-down cycle. Accordingly, if an integrated circuit has a large number of buffer circuits therein that frequently switch appreciable loads, the amount of switching current required from the power supply may be substantial.

SUMMARY OF THE INVENTION

It is therefore an object of the present invention to provide improved integrated circuit devices and methods of operating same.

It is another object of the present invention to provide integrated circuit devices having substantially reduced power consumption requirements and methods of operating same.

It is still another object of the present invention to provide integrated circuit devices containing improved buffers therein with enhanced energy efficiency characteristics, and methods of operating same.

These and other objects, advantages and features of the present invention are provided by preferred integrated circuit devices that according to one embodiment of the present invention comprise an integrated circuit substrate, a plurality of output buffers in the substrate that drive respective loads, a first supplemental voltage supply pad on the substrate, a plurality of first switches and at least one external capacitor that is electrically coupled to the first supplemental voltage supply pad. This external capacitor acts as a supplemental voltage supply to maintain the first supplemental voltage supply pad at an intermediate voltage. According to a preferred aspect of this embodiment, each of the first switches is electrically coupled in series between an output of a respective one of the plurality of output buffers and the first supplemental voltage supply pad. Because each output buffer may comprise a pull-up switch and a pull-down switch, each output buffer and respective first switch may be treated as at least three independently controllable switches: a switch to pull the output towards a first intermediate voltage at the first supplemental voltage supply pad, a switch to pull the output towards a power supply voltage Vcc and a switch to pull the output towards a ground reference voltage Vss.

In particular, during operation of a preferred device, the first switch may be closed (turned on) to transfer charge from the at least one external capacitor (e.g., 1 pF) to a capacitive load (e.g., 100 pF) which is electrically connected to an output of a respective output buffer. This capacitive load may be formed by an "on-chip" device and/or "off-chip" device, for example. This transfer of charge occurs at the beginning of a pull-up time interval as the voltage across the capacitive load is being driven from a ground reference voltage Vss to a first intermediate voltage V1 (where Vss<V1<Vcc) while the pull-up and pull-down switches of the respective output buffer are both maintained in a high impedance state (turned off). Then, after this "forward" charge transfer to the load, the first switch may be opened (turned off). The pull-up switch of the respective output buffer can then be closed (turned on) in a pull-up mode to drive the corresponding capacitive load from the first intermediate voltage V1 to the power supply voltage Vcc using current supplied by the power supply. The pull-up switch remains closed (turned on) as long as a high output voltage is required.

Then, when it is required to switch the output from a high level to a low level, the pull-up switch is turned off and the first switch is turned on again to transfer charge back from the capacitive load to the at least one external capacitor and thereby pull the output towards the first intermediate voltage on the supplemental voltage supply pad. This "reverse" transfer of charge preferably occurs at the beginning of a pull-down time interval as the voltage across the capacitive load is being driven from the power supply voltage Vcc to a second intermediate voltage V2 (where Vss<V2<Vcc). This "reverse" charge transfer from the capacitive load to the supplemental voltage supply essentially replaces the "forward" charge transferred from the supplemental voltage supply to the capacitive load during the first portion of the pull-up time interval. Then, after this reverse charge transfer from the load, the first switch is turned off (opened) and the respective output buffer is placed in a pull-down mode by turning the pull-down switch on to thereby drive the output from the intermediate voltage V2 to the ground (or negative) reference voltage Vss.

Based on this embodiment of the present invention, the overall power consumed by an output buffer when driving a capacitive load through a pull-up/pull-down cycle can be reduced considerably by essentially "recycling" the charge initially passed from the at least one external capacitor to the load during the forward charge transfer, as charge returned to the at least one external capacitor during the reverse charge transfer. This means that significant portions of each pull-up/pull-down cycle do not consume power from the power supply, which makes the present invention particularly suited for battery powered devices. However, additional delay may be incurred because the total time required to perform the initial forward charge transfer and also pull-up the load from V1→Vcc is typically greater than the amount of time it would otherwise take for the output driver to drive the capacitive load directly from Vss to Vcc. The same is true for the pull-down portion of each cycle. To improve its "start-up" characteristics, the above-described embodiment may also include a pair of external capacitors that are electrically connected in series between the power supply voltage Vcc and the ground reference voltage Vss and electrically connected together at the first supplemental voltage supply pad.

According to another embodiment of the present invention, an integrated circuit device is provided that comprises an integrated circuit substrate, an output buffer in the substrate, first and second supplemental voltage supply pads on the substrate, first and second switches which each have an input electrically connected to an output of the output buffer, and first and second external capacitors which are electrically connected in series between Vcc and Vss and together at an intermediate reference node. The outputs of the first and second switches are also electrically connected to the first and second supplemental voltage supply pads. In addition, first and second external inductors are preferably provided. The first inductor is electrically connected in series between the intermediate reference node and the first supplemental voltage supply pad and the second inductor is electrically connected in series between the intermediate reference node and the second supplemental voltage supply pad. The first and second switches may be provided as a single CMOS transmission gates, for example, or the first and second switches may comprise separately controllable NMOS and PMOS transistors, respectively. Other types of switches may also be used.

According to this embodiment of the present invention, the first switch may be closed (and the second switch may be opened) to transfer charge from the first and second external capacitors through the first inductor to the capacitive load which is electrically connected to an output of the output buffer. This transfer of charge preferably occurs at the beginning of a pull-up time interval as the voltage across the capacitive load is being driven from a ground reference voltage Vss to a first intermediate voltage V1 (where Vss<V1<Vcc) while the PMOS pull-up transistor and the NMOS pull-down transistor are maintained in high impedance states (i.e., off). Then, after this "forward" charge transfer to the load, the first switch can be opened (turned off) and the PMOS pull-up transistor of the respective output buffer can be turned on to pull-up the corresponding capacitive load from the first intermediate voltage V1 to the power supply voltage Vcc using current supplied by the power supply. This action completes the pull-up cycle.

To initiate a pull-down cycle, the PMOS pull-up transistor is turned off and the second switch is then closed to transfer of charge back from the capacitive load through the second inductor to the first and second external capacitors. This reverse transfer of charge preferably occurs at the beginning of a pull-down time interval as the voltage across the capacitive load is being driven from the power supply voltage Vcc to a second intermediate voltage V2 (where Vss<V2<Vcc). Then, after this "reverse" charge transfer from the capacitive load, the second switch can be opened (turned off) and the NMOS pull-down transistor of the respective output buffer can be turned on to pull the corresponding capacitive load from the second intermediate voltage V2 to the ground reference voltage Vss by sinking current away from the capacitive load. Therefore, like the other embodiment of the present invention described above, the overall power consumed by an output buffer when driving a capacitive load through a pull-up/pull-down cycle can be reduced considerably by essentially "recycling" the charge passed from the first and second external capacitors to the load during the forward charge transfer, as charge returned to the first and second capacitors during the reverse charge transfer.

Moreover, because the forward charge transfer utilizes the first inductor (L1) and capacitive load ($C_L$) as a series RLC circuit (where the closed first switch contributes "R" as the on-state resistance of an NMOS transistor or CMOS transmission gate, for example), the voltage waveform across the capacitive load $C_L$ may overshoot ½ Vcc by a considerable margin during the first portion of the pull-up time interval (i.e., $V1_{max}$>½ Vcc). In particular, by proper choice of R (small) and L1 (large) for a given $C_L$, the voltage waveform across the capacitive load, which has a resonant period of about $2\pi(L1C_L)^{1/2}$, may reach a first maximum of about 0.8(Vcc) or thereabouts. Thus, if the first switch is opened at the point in time when the voltage waveform across the capacitive load is at or near the first maximum during the first portion of the pull-up time interval, the amount of power supply current provided by the output buffer during the remaining portion (i.e., second portion) of the pull-up time interval can be reduced to an even greater extent since very little additional pull-up is needed. Likewise, because the reverse charge transfer utilizes the second inductor (L2) and capacitive load ($C_L$) as a series RLC circuit (where the closed second switch contributes "R" as the on-state resistance of an NMOS transistor or CMOS transmission gate, for example), the voltage waveform across the capacitive load may undershoot ½ Vcc by a considerable margin during the first portion of the pull-down time interval (i.e., $V2_{min}$<½ Vcc). In particular, by proper choice of R and L2 for a given $C_L$, the voltage waveform across the capacitive load, which has a resonant period of $2\pi(L2C_L)^{1/2}$, may reach a first minimum of about 0.2 Vcc or thereabouts. Then, if the second switch is opened at the point in time when the voltage waveform across the capacitive load is at or near the first minimum during the first portion of the pull-down time interval, the amount of power supply current which is received by the output buffer during the remaining portion of the pull-down time interval can also be reduced considerably.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout and signal lines and signals thereon may be referred to by the same reference symbols. Moreover, the terms "power supply voltage" and "ground reference voltage" are intended to cover not only situations where the signal lines Vcc and Vss are powered at +X volts and 0 volts, respectively, but also situations where Vcc and Vss are both positive voltages, both negative voltages or positive and negative voltages. In other words, these alternative power supply voltages are treated herein and in the claims as having been normalized (i.e., level shifted) to +X volts and 0 volts.

Figure 1:
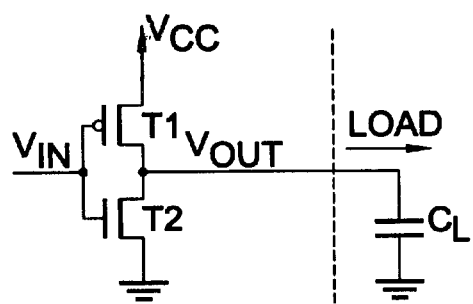
FIG. 1 is an electrical schematic of a conventional output buffer.
Figure 2:
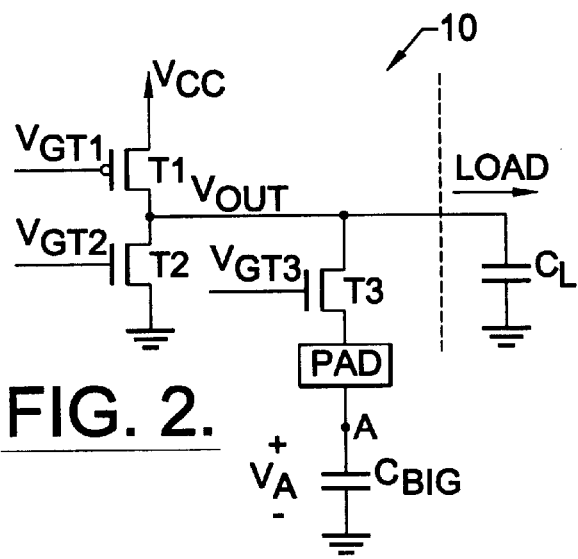
FIG. 2 is an electrical schematic of an integrated circuit device according to a first embodiment of the present invention.

Referring now to FIG. 2, an electrical schematic of an integrated circuit device 10 according to a first embodiment of the present invention will be described. The integrated circuit device 10 comprises an integrated circuit substrate (e.g., semiconductor chip) having an output buffer (e.g., CMOS inverter) therein. The output buffer may comprise a single PMOS pull-up transistor T1 and a single NMOS pull-down transistor T2. These transistors T1 and T2 are electrically connected in series (e.g., source-to-drain) between a positive power supply voltage Vcc and a ground reference voltage (Vss). These transistors may also be matched so that the Vout/Vin characteristics of the CMOS inverter are symmetric about Vcc/2 (where Vin=$V_{GT1}$ and $V_{GT2}$). According to a preferred aspect of this embodiment, an NMOS transistor T3 may be provided as a switch which is responsive to a control signal (shown as $V_{GT3}$). The NMOS transistor T3 is preferably electrically connected in series (e.g., source-to-drain) between an output Vout of the output buffer and a first supplemental voltage supply pad (PAD). This supplemental voltage supply pad may extend adjacent a periphery of the integrated circuit substrate. A relatively large external capacitor ($C_{BIG}$) is also provided. For purposes of illustration herein, this external capacitor $C_{BIG}$ may have a capacitance of 1 μF and may be electrically connected in series between the first supplemental voltage supply pad and a ground reference signal line, as illustrated.

Operation of the integrated circuit device 10 in driving an on-chip or off-chip load having a predetermined load capacitance ($C_L$) will now be described. Relative to the external capacitor $C_{BIG}$, the load capacitor $C_L$ should be considerably smaller (i.e., $C_L \ll C_{BIG}$). For purposes of illustration only, the value of the load capacitor $C_L$ may be 100 pF. Operation of the device 10 of FIG. 2 includes the steps of setting the output of the output buffer in a high impedance state by setting $V_{GT2}$ to a logic 0 voltage and $V_{GT1}$ to a logic 1 voltage. These gate voltages act to turn off PMOS transistor T1 and turn off NMOS transistor T2. Next, NMOS transistor T3 is turned on by applying a logic 1 signal as $V_{GT3}$. Based on these steps and the assumption that Vout is initially set at a logic 0 voltage, the output Vout of the output buffer and capacitive load $C_L$ will be driven from Vss towards the voltage of node A. Here, if the external capacitor $C_{BIG}$ has initially been charged to a level of Vcc/2, the output Vout will be driven from 0 Volts to V1 (where V1≈Vcc/2) during a first portion of a pull-up time interval. During this step, the voltage at node A will decrease slightly below Vcc/2 because the original charge on capacitor $C_{BIG}$ is now shared between $C_{BIG}$ and $C_L$. That is:

$$(Vcc/2)C_{BIG}=V_A C_{BIG}+V_1 C_L \quad (1)$$

at the end of the first portion of the pull-up time interval. Next, NMOS transistor T3 is turned off and PMOS transistor T1 is turned on to pull the output Vout from V1 to Vcc during a second portion of the pull-up time interval. During this second portion of the pull-up time interval, the amount of charge to be provided from the power supply to the capacitive load (via PMOS transistor T1) will be equal to:

$$Q_{pull-up}=C_L(Vcc-V1)\approx C_L(Vcc/2) \quad (2)$$

which is approximately one-half the amount of charge required by a conventional output buffer during a pull-up time interval.

Switching the output of the device 10 from a high voltage to a low voltage during a pull-down time interval includes the steps of setting the output Vout of the output buffer in a high impedance state by setting $V_{GT2}$ to a logic 0 voltage and $V_{GT1}$ to a logic 1 voltage to turn off PMOS transistor T1 and turn off NMOS transistor T2. Then, NMOS transistor T3 is turned on by applying a logic 1 signal as $V_{GT3}$. Based on these steps, a "reverse" transfer of charge will take place from the capacitive load $C_L$ to the external capacitor $C_{BIG}$ as the output Vout of the output buffer and the capacitive load $C_L$ are pulled down from Vcc to a level V2 during a first portion of the pull-down time interval. Here, V2 ideally equals the voltage of node A, where $V_A \approx Vcc/2$. Next, NMOS transistor T3 is turned off and NMOS transistor T2 is turned on to pull the output Vout from V2 to Vss during a second portion of the pull-down time interval. During this second portion of the pull-down time interval, the amount of charge the power supply will have to sink from the capacitive load will be equal to:

$$Q_{pull-down}=C_L(V2)\approx C_L(Vcc/2) \quad (3)$$

which is approximately one-half the amount of charge required by a conventional output buffer during a pull-down time interval. Thus, if we neglect to take into account the small amount of charge required to turn-on and off NMOS transistor T3 twice during a complete pull-up/pull-down cycle, the integrated circuit device 10 of FIG. 2 will consume about one-half the amount of power that an otherwise equivalent conventional output buffer will require.

However, this above analysis does not take into account the relatively significant amount of charge initially required to charge $C_{BIG}$ from 0 Volts to ½ Vcc upon start-up. If this charge is required, then a significant number of pull-up/pull-down cycles will have to occur before a noticeable amount of power savings can actually be achieved. This analysis also does not take into account the fact that upon start-up, a relatively large number of cycles will need to be experienced before node A will even become fully charged to a level of about Vcc/2, since only a relatively small amount of net additional charge will actually be provided from the capacitive load $C_L$ to $C_{BIG}$ during the first portion of each of the initial pull-down time intervals.

Figure 3:
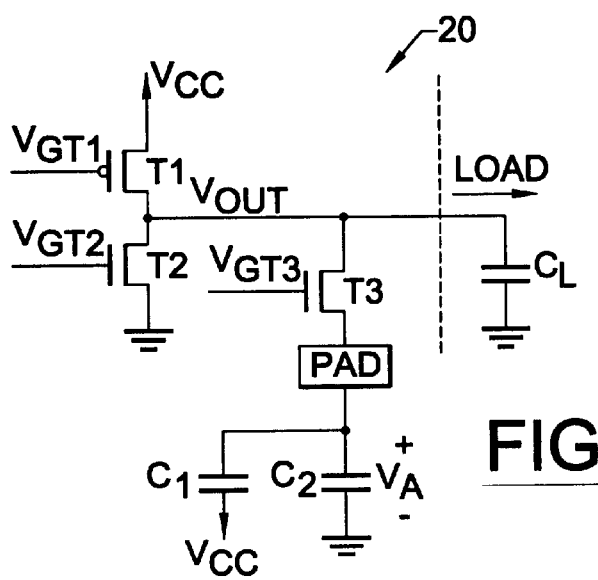
FIG. 3 is an electrical schematic of an integrated circuit device according to a second embodiment of the present invention.

To address this latter limitation of the embodiment of FIG. 2, a more preferred embodiment of an integrated circuit device 20 according to the present invention includes a pair of large external capacitors that are electrically connected in series between the power supply voltage Vcc and the ground reference voltage Vss, as illustrated by FIG. 3. By using first and second large external capacitors C1 and C2, which each may have a value of 1 μF, the voltage $V_A$ at node A will be established at a level of ½ Vcc immediately upon start-up if C1 equals C2. The operation of the integrated circuit device 20 of FIG. 3 is otherwise essentially identical to the device 10 of FIG. 2, and need not be described further herein.

Figure 4:
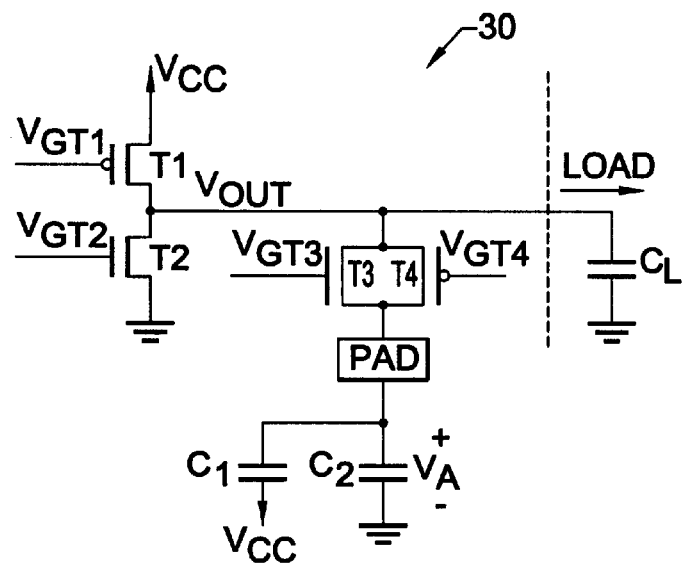
FIG. 4 is an electrical schematic of an integrated circuit device according to a third embodiment of the present invention.

Referring now to FIG. 4, an integrated circuit device 30 according to a third embodiment of the present invention is illustrated. This device 30 is similar to the device 20 of FIG. 3, however, the first switch is provided as a CMOS transmission gate instead of solely an NMOS transistor T3. As illustrated, the CMOS transmission gate includes an NMOS transistor T3 and a PMOS transistor T4 connected in parallel. The operation and electrical characteristics of CMOS transmission gates are more fully described at section 8.12 of a textbook by Sedra and Smith entitled "Microelectronic Circuits", Holt, Rinehart and Winston, (1982), the disclosure of which is hereby incorporated herein by reference. According to a preferred aspect of this embodiment, the switch can be closed by turning on PMOS transistor T4 during the first portion of the pull-up time interval when charge is being transferred in a "forward" direction from the external capacitors C1 and C2 to the load, or turning on NMOS transistor T3 during the first portion of the pull-down time interval when charge is being transferred in a "reverse" direction back from the capacitive load to the external capacitors C1 and C2.

Based on this aspect of the third embodiment, the total amount of charge required to drive the CMOS transmission gate through an entire pull-up/pull-down cycle is not increased relative to the amount of charge require to drive the NMOS transistor of FIG. 3. Moreover, by using PMOS transistor T4 during pull-up and PMOS transistor T4 during pull-down, the series resistance of the first switch may be maintained at a more constant level during the pull-up interval and the pull-down interval since the gate-to-drain voltage Vgd and gate-to-source voltage Vgs can be maintained above (or below) the respective transistor's threshold voltage. However, if the amount of charge required to drive the CMOS transmission gate is not critical, then an inverter can be provided so that both the NMOS transistor T3 and PMOS transistor T4 (which may be differently sized) can be turned on and off simultaneously by the same control signal (see, e.g., FIGS. 5–6), to thereby reduce the total on-state switch resistance during pull-up and pull-down.

The embodiment of FIG. 4 may also be used in combination with a timing circuit (not shown) that takes advantage of the timing of reflected transmission line signals to drive transmission line loads in an efficient manner. For example, if the on-state resistance of the CMOS transmission gate of FIG. 4 is 12.5 ohms, the on-state resistances of PMOS and NMOS transistors T1 and T2 are 50 ohms, and the capacitive load $C_L$ is replaced by a 5 ns transmission line having a characteristic impedance of 50 ohms, then the output voltage Vout will switch from Vss to a level of 0.8(½ Vcc)=0.4 Vcc when the CMOS transmission gate is turned on at the commencement of a pull-up time interval. Then, at 5 ns$^+$ from the time the transmission gate is closed, a signal having a magnitude of 2(0.4 Vcc)=0.8 Vcc will be reflected back from the end of the transmission line to the output node Vout of the buffer and will arrive at the output node at 10 ns. At this time, the timing circuit can be used to simultaneously switch off the CMOS transmission gate and turn on the PMOS pull-up transistor T1. When this occurs at 10 ns$^+$, the magnitude of Vout will switch from 0.8 Vcc to 0.9 Vcc. Based on a reflected signal having a magnitude of 1.0 Vcc, the magnitude of Vout will switch from 0.9 Vcc to Vcc at 20 ns. When this event occurs, no further current will be provided by the power supply until a pull-down cycle next occurs. If a pull-down cycle is then initiated at 30 ns by turning on the CMOS transmission gate, charge will be recycled to the external capacitors and the magnitude of Vout will switch downward from Vcc to 0.6 Vcc. Based on reflection, the magnitude of Vout will then switch downward from 0.6 Vcc to 0.2 Vcc at 40 ns. At 40 ns, the timing circuit can be used to simultaneously switch off the CMOS transmission gate and turn on the NMOS pull-down transistor T2. When this occurs at 40 ns$^+$, the magnitude of Vout will switch from 0.2 Vcc to 0.1 Vcc. Based on a reflected signal having a magnitude of 0 Vcc, the magnitude of Vout will switch from 0.1 Vcc to 0 Volts at 50 ns, thus completing the pull-down cycle.

Figure 5:
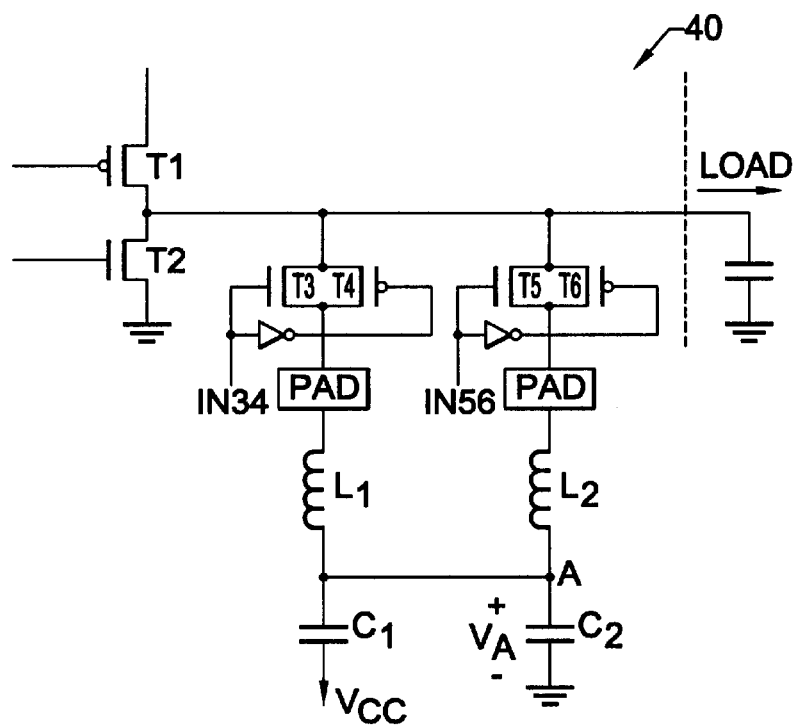
FIG. 5 is an electrical schematic of an integrated circuit device according to a fourth embodiment of the present invention.

Referring now to FIG. 5, an integrated circuit device 40 according to a fourth embodiment of the present invention is illustrated. This device 40 is similar to the device 30 of FIG. 4, however, a second switch is provided (e.g., as a second CMOS transmission gate), a second supplemental voltage supply pad is provided and first and second external inductors L1 and L2 are provided and connected as illustrated. The operation of this device 40 is similar to the operation of the device 30 of FIG. 4, however, the first CMOS transmission gate formed by transistors T3 and T4 is preferably only turned on during the first portion of the pull-up time interval and the second CMOS transmission gate formed by transistors T5 and T6 is preferably only turned on during the first portion of the pull-down time interval. Accordingly, the "forward" charge transfer passes through inductor L1 and the first switch, and the "reverse" charge transfer passes through inductor L2 and the second switch. The operation of the device 40 of FIG. 5 will now be more fully described.

In particular, the first switch formed by the first CMOS transmission gate may be closed when signal line IN34 is switched from a logic 0 voltage to a logic 1 voltage to facilitate the transfer of charge from the first and second external capacitors C1 and C2 through the first inductor L1 to the capacitive load $C_L$. This transfer of charge preferably occurs at the beginning of the pull-up time interval as the voltage across the capacitive load is being driven from a ground reference voltage Vss to a first intermediate voltage V1 (where Vss<V1<Vcc). Then, after this "forward" charge transfer to the load, the first switch can be opened and then the pull-up transistor T1 can be turned on to drive the corresponding load from the first intermediate voltage V1 to the power supply voltage Vcc using current supplied by the power supply. The second switch formed by the second CMOS transmission gate may then be closed upon commencement of a pull-down cycle by driving signal line IN56 to a logic 1 voltage. This facilitates the reverse transfer of charge back through the second inductor L2 to the first and second external capacitors C1 and C2. This reverse transfer of charge preferably occurs at the beginning of a pull-down time interval as the voltage across the capacitive load $C_L$ is being driven from the power supply voltage Vcc to a second intermediate voltage V2 (where Vss<V2<Vcc). Then, after this "reverse" charge transfer from the load, the second switch can be opened and the NMOS transistor T2 can be turned on to drive the capacitive load $C_L$ from the second intermediate voltage V2 to the ground reference voltage Vss by sinking current away from the capacitive load $C_L$. Thus, like the embodiments of FIGS. 2–4, the device 40 of FIG. 5 can reduce the overall power consumed by an output buffer when driving a capacitive load through a complete pull-up/pull-down cycle, by essentially "recycling" the charge passed from the first and second external capacitors to the load during the forward charge transfer as charge returned to the first and second capacitors during the reverse charge transfer.

But, because the forward charge transfer utilizes the first inductor (L1) and capacitive load ($C_L$) as a series RLC circuit, where the closed first switch contributes "R" as the on-state resistance of the CMOS transmission gate, the voltage waveform across the capacitive load may overshoot ½ Vcc by a considerable margin during a first portion of the pull-up time interval. In particular, by proper choice of R and L1 for a given $C_L$, the voltage waveform across the capacitive load, which has a resonant period of about $2\pi(L1 C_L)^{1/2}$, may overshoot ½ Vcc and may reach a maximum of about 0.7(Vcc), 0.8(Vcc) or even about 0.9(Vcc). The overshoot depends entirely on the resistance of the switch relative to the critical resistance of the series RLC circuit. The critical resistance is equal to $2(L/C)^{1/2}$. If the on-state switch resistance is greater than or equal to the critical resistance, their is no overshoot. If it is less than the critical resistance, their is overshoot. If it is much less than the critical resistance, there is significant overshoot. A low resistance switch can therefore be used advantageously to maximize overshoot, but a low resistance switch typically requires a significant amount of charge when switching on and off.

Overshoot is also increased by increasing the value of the inductor, but this slows down the first part of the pull-up or pull-down cycle. A good compromise between these conflicting requirements achieves an overshoot on pull up of about 0.8 Vcc. Thus, if the first switch is opened at the point in time when the voltage waveform across the capacitive load is at or near a maximum during the first portion of the pull-up time interval, the amount of power supply current provided by the output buffer during the remaining portion of the pull-up time interval can be reduced to an even greater extent. Likewise, because the reverse charge transfer utilizes the second inductor (L2) and capacitive load ($C_L$) as a series RLC circuit, the voltage waveform across the capacitive load may undershoot ½ Vcc by a considerable margin during a first portion of the pull-down time interval. Once again, by proper choice of R and L2 for a given $C_L$, the voltage waveform across the capacitive load, which has a resonant period of about $2\pi(L2 C_L)^{1/2}$, may reach a minimum of about 0.2 Vcc or thereabouts. Thus, if the second switch is opened at the point in time when the voltage waveform across the capacitive load is at or near a minimum during the first portion of the pull-down time interval, the amount of power supply current which is removed from the output buffer during the remaining portion of the pull-down time interval can also be reduced considerably. As will be understood by those skilled in the art, if a minimum logic 1 level (logic 0 level) at the input of a device being driven by the output buffer is 0.65 Vcc (0.35 Vcc), for example, latency is not compromised during pull-up (or pull-down), however bandwidth will be comprised to some extent, as explained more fully hereinbelow.

In fact, if the value of $R_{switch1}$ and L1 are properly selected to achieve a maximum Vout of 0.8 Vcc during the first portion of the time interval and if the value of $R_{switch2}$ and L2 are properly selected to achieve a minimum Vout of 0.2 Vcc during the first portion of the pull-down time interval, then each complete pull-up/pull-down cycle requires a charge of only 0.4(Vcc)($C_L$). This compares to a charge of 2(Vcc)($C_L$) required by an otherwise equivalent conventional output buffer. This calculation neglects to take into account the additional amount of charge that is required to drive the first and second CMOS switches during the first portions of the pull-up and pull-down time intervals. This calculation also fails to take into account the power consumed by a timing circuit (not shown) which will need to monitor Vout and selectively turn off the first switch when Vout reaches its maximum value of 0.8 Vcc during pull-up and turn off the second switch during pull-down when Vout reaches its minimum value of about 0.2 Vcc.

Figure 7A:
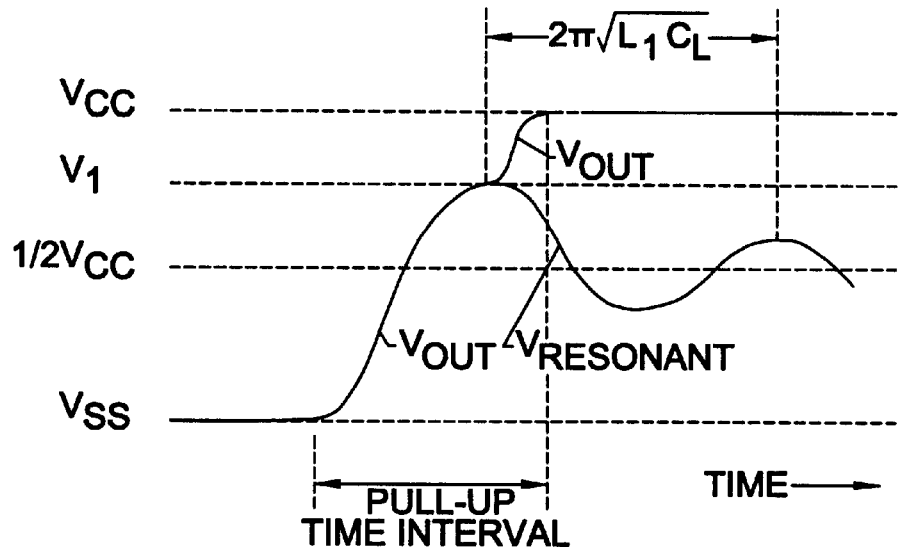
FIGS. 7A–7B are graphs of Vout versus time during a pull-up time interval and a pull-down time interval, respectively, in accordance with the present invention.
Figure 7B:
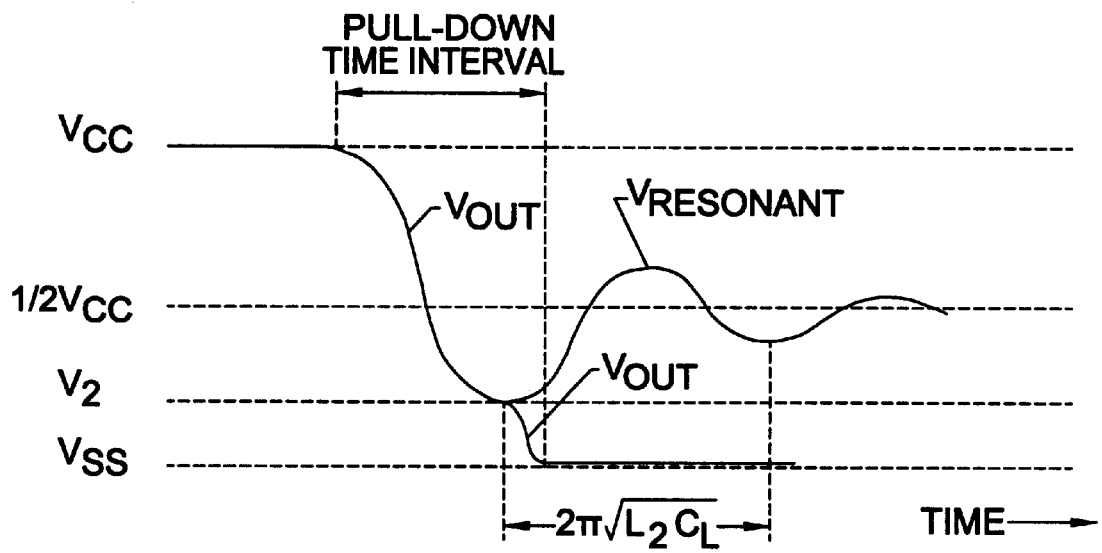

Referring now to FIGS. 7A–7B, graphs of Vout versus time during a pull-up time interval and a pull-down time interval, respectively, are provided. As illustrated by FIG. 7A, the voltage across the capacitive load $C_L$ would follow the curve $V_{resonant}$ in the event the first switch remains conductive at the end of the first portion of the pull-up time interval and the PMOS pull-up transistor T1 is not turned on to complete the pull-up transition. This, of course, is not allowed to occur in the actual operation of the circuit. The curve Vout, on the other hand, represents the voltage at the output of the output buffer in the event the first switch is closed after detecting a peak in the voltage at the output (e.g., where (dVout/dt)=0) at the end of the first portion of the pull-up time interval, and the pull-up transistor T1 is then turned on. Referring now to FIG. 7B, the voltage across the capacitive load $C_L$ will follow the curve $V_{resonant}$ in the event the second switch remains open at the end of the first portion of the pull-down time interval and the NMOS pull-down transistor T2 is not turned on to complete the pull-down transition. The curve Vout represents the voltage at the output of the output buffer in the event the second switch is closed after detecting a minimum in the voltage at the output (e.g., where (dVout/dt)=0) during the first portion of the pull-down time interval, and the pull-down transistor T2 is then turned on. The resonant period of the second portion of the pull-up or pull-down intervals is much less than the period of the first portion of the pull-up or pull-down time intervals. This is because the external inductance in the Vcc or Vss power supplies is much lower than the inductance L1 and L2 added to the supplemental voltage supply.

Figure 6:
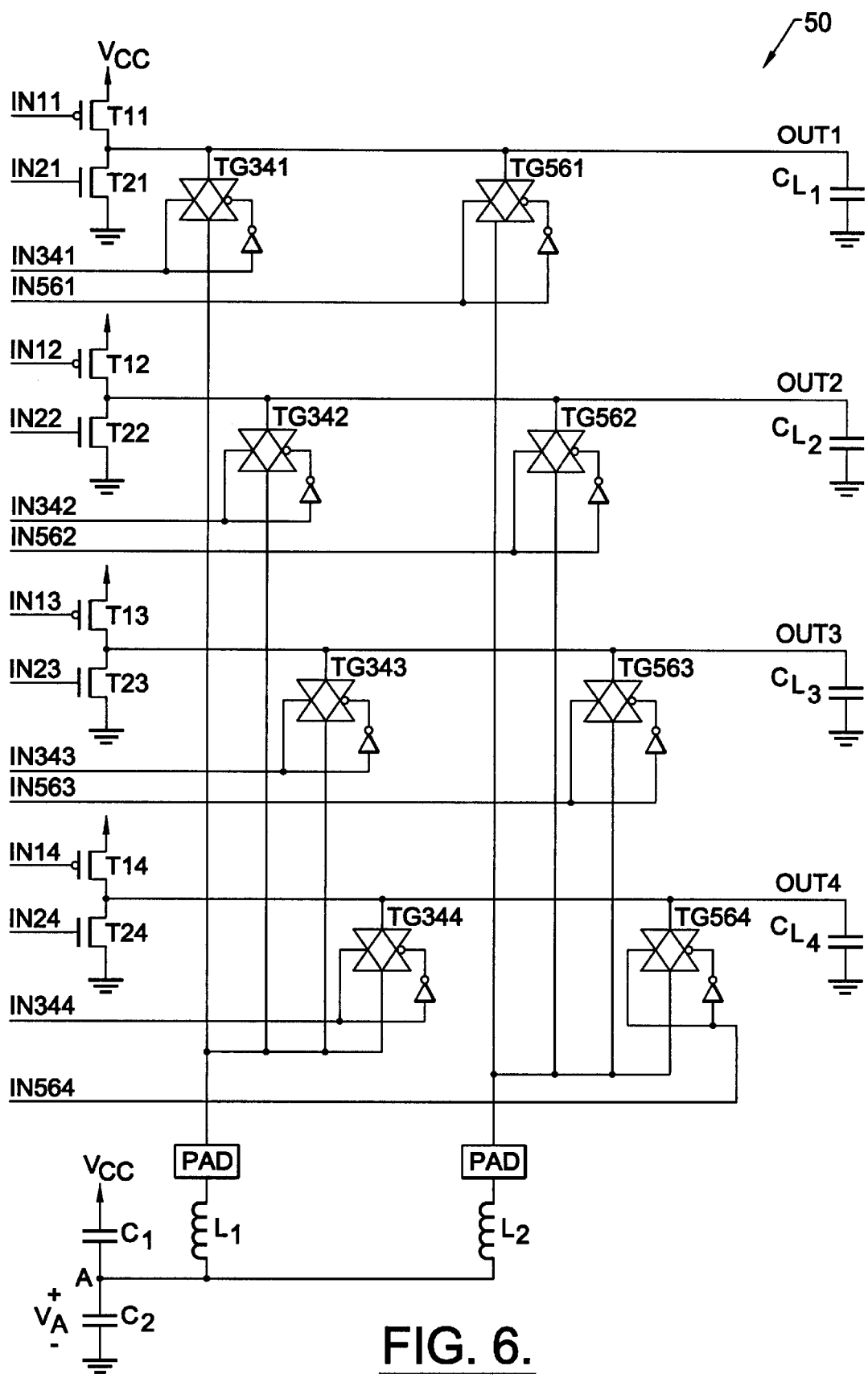
FIG. 6 is an electrical schematic of an integrated circuit device according to a fifth embodiment of the present invention.

Referring now to FIG. 6, an integrated circuit device 50 according to a fifth embodiment of the present invention is illustrated. This embodiment is similar to the embodiment of FIG. 5, however, a plurality of output buffers are provided and each of these buffers drives a respective capacitive load ($C_{L1}$–$C_{L4}$). As illustrated, the first output buffer receives input signals IN11 and IN21 and has an output (OUT1) which is electrically coupled via transmission gate TG341 and TG561 to the first and second supplemental voltage supply pads, respectively. Transmission gates TG341 and TG561 are responsive to control signals IN341 and IN561, respectively. Likewise, the second output buffer receives input signals IN12 and IN22 and has an output (OUT2) which is electrically coupled via transmission gates TG342 and TG562 to the first and second supplemental voltage supply pads, respectively. Transmission gates TG342 and TG562 are responsive to control signals IN342 and IN562, respectively. The third and fourth output buffers are connected in a similar manner, as illustrated. Based on this embodiment of the present invention, one or more of the transmission gates TG341–TG344 can be operated synchronously during a pull-up time interval and one or more of the transmission gates TG561–TG564 can be operated synchronously during a pull-down time interval, in response to control signals IN341–IN344 and IN561–IN564 which are generated by a timing circuit (not shown). The timing circuit should be able to account for the fact that the effective $RL_1C$ circuit established during a pull-up cycle and the effective $RL_2C$ circuit established during a pull-down cycle will vary depending on the number of transmission gates that are turned on simultaneously. For example, if transmission gates TG341, TG342 and TG344 are identical and are switched synchronously during a pull-up time interval (and $CL_1=CL_2=CL_4$), then the effective R and C of the resonant circuit during pull-up will be $\frac{1}{3}R_{TG341}$ and $3C_{L1}$. These values of the RLC circuit will change frequently during consecutive pull-up and pull-down time intervals. Moreover, the number of transmission gates which can be connected to a respective supplemental voltage supply pad can be set somewhat arbitrarily so long as the following condition is satisfied:

$$C1, C2 >> (C_{L1}+C_{L2}+\ldots+C_{Ln}) \quad (7)$$

where "n" represents the number of first or second transmission gates that are electrically connected to a respective supplemental voltage supply pad.

Accordingly, if there were a single output buffer on the integrated circuit, a circuit (not shown) similar to FIG. 4 but including an inductor between a single supplemental voltage supply pad and the capacitor(s) would provide the benefits of the present invention. A single transmission gate would provide the switch function for the first part of the pull up or pull down cycle. But a typical digital integrated circuit has many outputs, all switching simultaneously. For example, all the outputs on a random access memory device switch together. To provide for multiple outputs, two inductors $L_1$ and $L_2$ are used, as illustrated by FIG. 6. Each output that is to switch from low to high has its first transmission gate (i.e. TG 341–TG 344) enabled during the first time interval. That is, inductor $L_1$ switches from one to all of the outputs from low (Vss) toward high, perhaps to 0.8 Vcc. At the same time, each output that is to switch from high to low has its second transmission gate (i.e. TG 561–TG 564) enabled during the first time interval. Inductor $L_2$ sinks the current to switch from none to all the outputs from high (Vcc) toward low, perhaps 0.2 Vcc.

Note that some of the outputs may not switch in any given cycle. If an output was low and is to remain low, the NMOS pull down (to Vss) transistor remains on. If an output was low, but was driven by another chip (a bidirectional inpuvoutput), the NMOS pull down transistor turns on to maintain the low output. If, on the other hand, an output was high and is to remain high, the PMOS pull up transistor (to Vcc) remains on, or if previously driven by another integrated circuit, turns on.

All outputs that were low, whether driven by this circuit or another circuit, and are to switch high have their first transmission gate enabled simultaneously. Thus, they all switch together from low (Vss) past the reference voltage (½ Vcc) to a peak voltage of perhaps 0.8 Vcc. Upon reaching the peak voltage (where dv/dt=0), the first transmission gates are turned off and the respective PMOS transistors are turned on to complete the pull up cycle. If a single output is switching from low to high, the total capacitance is low so the resonant period $Tr=2\pi\sqrt{LC}$ is a short time. That is, the single first transmission gate is quickly turned off. If, instead, all outputs are switching from low to high, the total capacitance is high, and the resonant period is longer. If sixteen outputs switch high, the first time interval is four times as long as it is for a single output switching high. In each case, the voltage on the first supplemental supply voltage pad at the top of inductor $L_1$ is monitored on the chip. When it starts to decrease, the first period is terminated for all the pull up transitions.

Similarly, all outputs that were high, whether driven high by this circuit or another circuit and are to switch low have their second transmission gate enabled simultaneously. Thus, they all switch together from high (Vcc) past the reference voltage (½ Vcc) to a minimum voltage of perhaps 0.2 Vcc. Upon reaching the minimum voltage (where dv/dt= 0), the second transmission gates are turned off and the respective NMOS transistors are turned on to complete the pull down cycle. As with the pull up, the resonant period of the pull down depends on the total number (i.e. total capacitance) of outputs being pulled down. When the second supplemental supply voltage (the node between $L_2$ and the second switches) starts to rise, the second switches are turned off and the NMOS pull down transistors complete the pull down cycle.

Note that when a few outputs are switching from low to high and many outputs are switching from high to low, the first transmission gates for the outputs that are rising turn off before the second transmission gates turn off for the outputs that are falling. Two separate circuits (not shown) monitor the two supplemental supply voltage inputs to determine the optimum time to terminate the respective first portions of the pull up and pull down time intervals.

The two transmission gates and the two supplemental supply voltage inputs from two separate inductors are required to separate the pull up current (through one inductor) from the pull down current (through the other inductor). If a single inductor were used, the circuitry would work perfectly if an output is switched in the same direction in every cycle. But it would fail to give the desired overshoot if, for example, half the inputs were switching from low to high and half were switching from high to low. In this case, the current through the inductor would be approximately zero, the supplemental supply voltage input would stay at about Vcc/2, and no overshoot would occur. For all practical purposes, in this case the charge from the high outputs is shared with the low outputs and both equilibrate to each other at Vcc/2. To achieve the power saving benefit of the overshoot, separate inductors for pull up and pull down are required.

To achieve the maximum power savings benefit of this technique for a multiple output circuit requires the circuitry of FIG. 6 or equivalent. Specifically, it requires separate pull up and pull down transmission gates for each output. All pull up transmission gates share an inductor and a supplemental supply voltage pad. All pull down transmission gates share a separate inductor and supplemental supply voltage pad. But the charge to pull up or to pull down is stored on the same capacitor node. This common capacitor node permits the charged required to pull up to be recovered during the pull down and vice versa. No other provision to charge or discharge the storage node is required. Furthermore, by including a pair of capacitors $C_1$ and $C_2$ of approximately equal value, at power up the storage node A starts and remains at its desired voltage of Vcc/2. Thereafter, each time an output switches from Vss to perhaps 0.8 Vcc through its first transmission gate, charge is removed from the storage node A. Each time the output is switched from Vcc to perhaps 0.2 Vcc through the second transmission gate, an equal amount of charge is added to the storage node A.

If the overshoot in the pull down transition exceeds that in the pull up transition, initially more charge would be added than subtracted in a cycle. The storage node would increase in voltage until the added charge equals the subtracted charge. If, for example, the pull up transition overshoots the storage node voltage by 40% while the pull down transition overshoots the storage node by 60%, the storage node would eventually stabilize at 0.533 Vcc. If Vcc is, for example, 3 volts, the storage node would stabilize at 1.6 volts. Under these conditions, with the rising transition overshooting the 1.6 volt storage node by 40%, the first time period raises an output from Vss to (1.4)(1.6 volts)=2.24 volts. The falling transition overshoots by 60% from 3 volts down to 1.6 (3V−1.6V)=2.24 volts. At this voltage, even with asymmetric overshoot, the charge removed during pull up is equal to the charge added during pull down. That is, the voltage on the storage node remains almost fixed, rising slightly whenever more outputs transition low than transition high and falling slightly whenever more outputs transition high than low. But for each output there is a low to high transition for each high to low transition so the voltage on the storage node remains relatively fixed.

For the above example with the outputs switching 2.24 volts during the first time interval (charge taken from or returned to the capacitor) and only switched by 3V−2.24V= 0.76 volts by the power supply Vcc or Vss, the current required to switch the outputs is only 0.76/3=25.3% of that required for a conventional output buffer. That is, over 75% of the normal power is saved.

This power saving technique has disadvantages. First, it requires a longer total time to switch an output than is required by a conventional buffer. For some applications, this longer time, limiting the maximum operating frequency, is not acceptable. And second, the output buffer is more complex, requiring more transistors and chip area. This increase is negligent. Third, the technique requires one or two extra input pins for the supplemental supply voltage supply. And fourth, for the greatest power saving, the technique requires two external inductors. In some integrated circuit packages, the package lead inductance may be high enough to do the required job, in which case separate discrete external inductors would not be required.

Up to this point, this disclosure has assumed the power saving technique is used only to drive outputs. Outputs typically drive much higher capacity loads than those found internally on the integrated circuit. Therefore, the power saved with this technique is far greater with output drivers than with internal node drivers. For most internal node drivers, the power saved in driving the node with this technique does not justify the extra delay in switching the node. But for some applications, the power saved may be the dominant issue. In this case, this technique may be applied in general to switch any node from high to intermediate to low or from low to intermediate to high to save power.

Figure 8A:
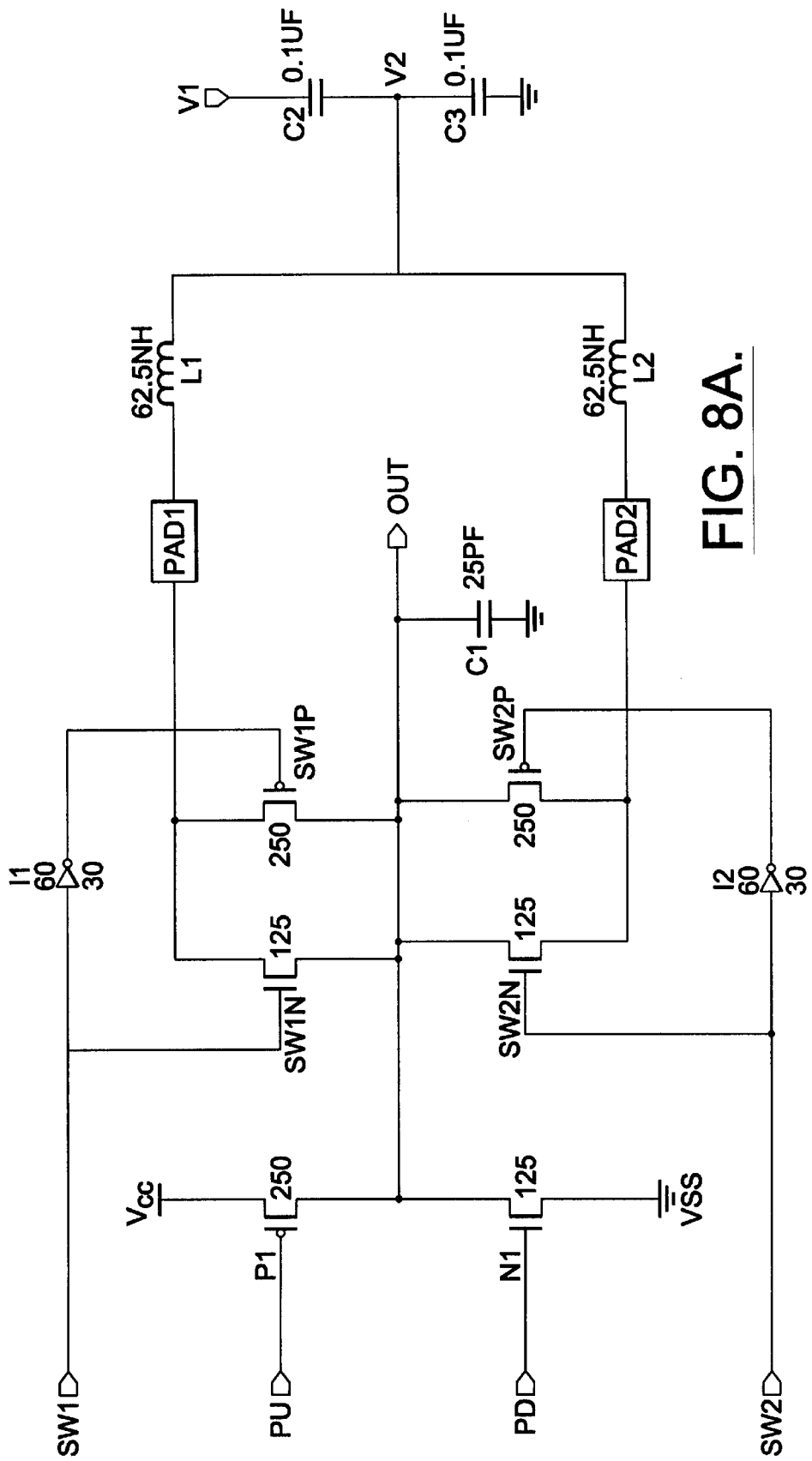
FIG. 8A is an electrical schematic of an embodiment of the present invention with exemplary device sizes illustrated.

These above described advantages of the present invention can also be illustrated by simulation of the integrated circuit device of FIG. 8A. In particular, the device of FIG. 8A comprises an output buffer having a pull-up transistor P1 (W=250 μm) and an NMOS transistor N1 (W=125 μm), connected as illustrated. PMOS transistor P1 is responsive to a pull-up signal (PU) and NMOS transistor N1 is responsive to a pull-down signal (PD). A first switch is provided by NMOS transistor SW1N (W=125 μm), PMOS transistor SW1P (W=250 μm) and a first inverter I1. A second switch is provided by NMOS transistor SW2N (W=125 μm), PMOS transistor SW2P (W=250 μm) and a second inverter 12. The first and second switches are responsive to first and second control signals SW1 and SW2. The load comprises a 25 picofarad capacitor C1. First and second supplemental voltage supply pads PAD1 and PAD2 are also provided. These supplemental voltage supply pads are electrically coupled to an intermediate reference node V2 by first and second inductors L1 and L2 which each have an inductance of 62.5 nanohenries. Two external capacitors C2 and C3, each having a capacitance of 0.1 μF, are electrically connected in series between a reference voltage level V1 (e.g., Vcc) and a ground reference potential. Based on this configuration, the device of FIG. 8A is similar to one of the output buffer stages of FIG. 6.

Figure 8B:
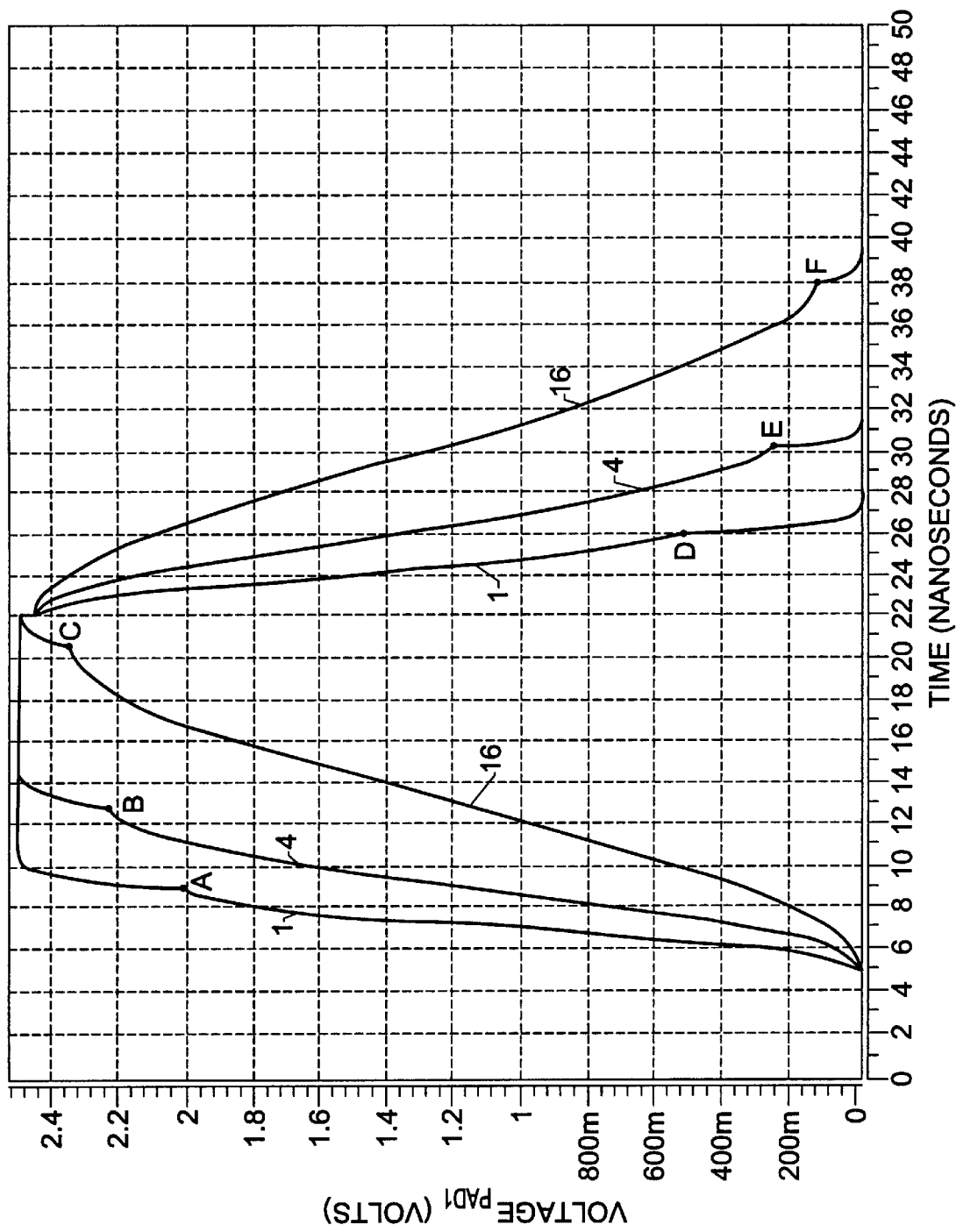
FIG. 8B is a plot of supplemental voltage supply pad voltage versus time for the device of FIG. 8A, during a complete pull-up/pull-down cycle, when switching one (1), four (4) and sixteen (16) identical capacitive loads simultaneously.

Referring now to FIG. 8B, a plurality of simulated waveforms are illustrated. These waveforms represent the voltages at a first supplemental voltage supply pad PAD1 of FIG. 8A during a complete pull-up/pull-down cycle. The first waveform (1) represents the voltage at PAD1 when only one capacitive load is being drive, the second waveform (4) represents the voltage at PAD1 when four identical capacitive loads are being driven by four output buffers simultaneously and the third waveform (16) represents the voltage at PAD1 when sixteen identical capacitive loads are being driven by sixteen output buffers simultaneously. Point A on the first waveform (1) represents the point at which the first switch is turned off and the PMOS pull-up transistor P1 is turned on to complete the pull-up cycle. Point B on the second waveform (4) represents the point at which the first switches of four respective output buffers are turned off simultaneously and the PMOS pull-up transistors P1 of these buffers are turned on. Likewise, Point C on the third waveform (16) represents the point at which the first switches of sixteen respective output buffers are turned off simultaneously and the PMOS pull-up transistors P1 of these buffers are turned on. As described above, the pull-up time associated with driving sixteen loads simultaneously is increased relative to the pull-up time associated with driving a single load (17 ns versus 5 ns of FIG. 8B), but more power is conserved on a per load basis when driving a plurality of loads simultaneously, as evidenced by the fact that point C is at a higher voltage than points B and A.

Likewise, point D on the first waveform (1) represents the point at which the second switch is turned off and the NMOS pull-down transistor N1 is turned on to complete the pull-down cycle. Point E on the second waveform (4) represents the point at which the second switches of four respective output buffers are turned off simultaneously and the NMOS pull-up transistors N1 of these buffers are turned on. Likewise, Point F on the third waveform (16) represents the point at which the second switches of sixteen respective output buffers are turned off simultaneously and the NMOS pull-down transistors N1 of these buffers are turned on. As described above, the pull-down time associated with driving sixteen loads simultaneously is increased relative to the pull-down time associated with driving a single load (17 ns versus 5 ns of FIG. 8B), but more power is conserved on a per load basis when driving a plurality of loads simultaneously, as evidenced by the fact that point F is at a lower voltage than points D and E.

Figure 9:
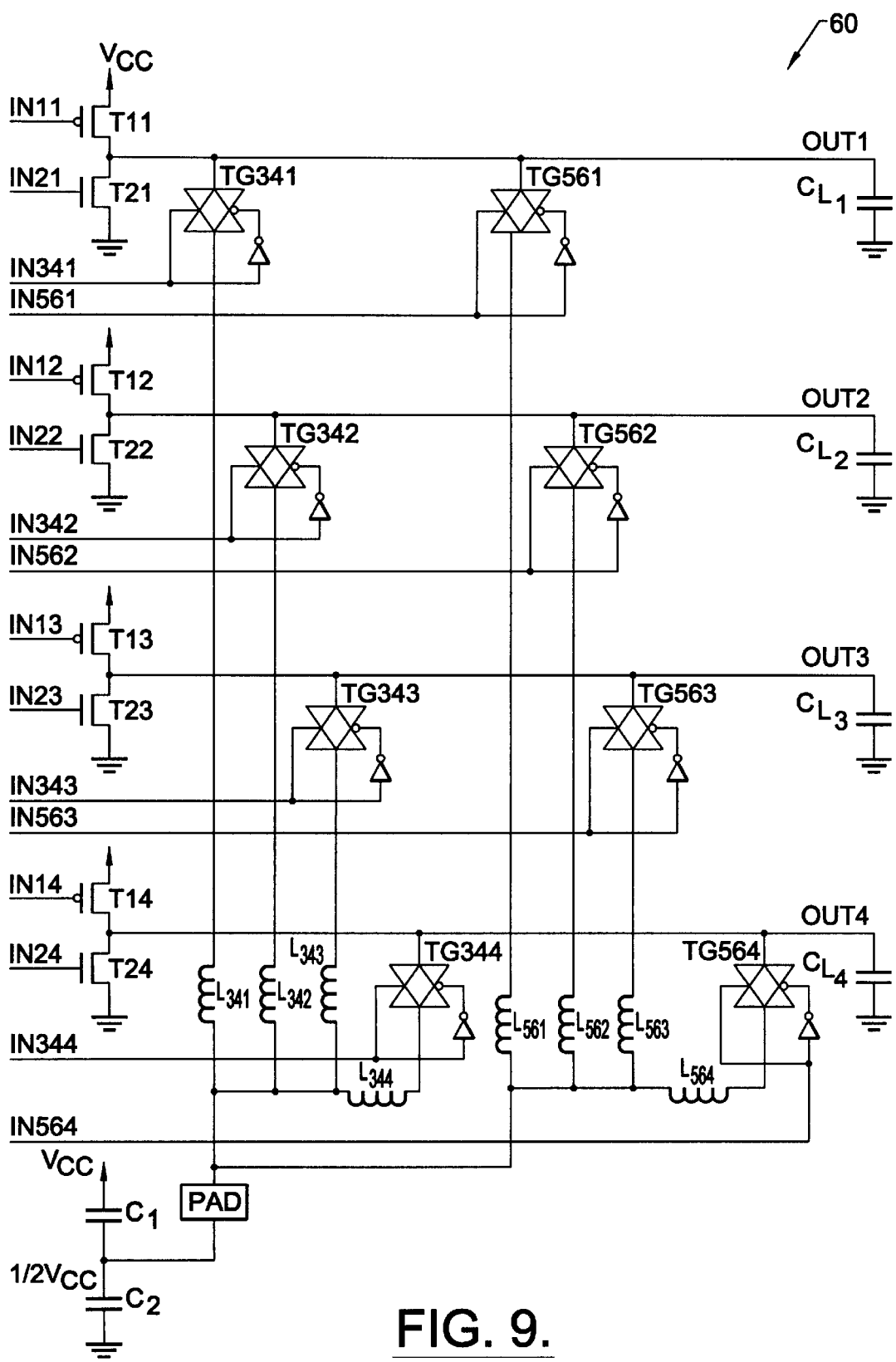
FIG. 9 is an electrical schematic of an integrated circuit device according to a sixth embodiment of the present invention.

Referring now to FIG. 9, an integrated circuit device 60 according to a sixth embodiment of the present invention is illustrated. This embodiment is similar to the embodiment of FIG. 6, however, on-chip inductors are used to enable asynchronous (i.e., independent) operation of each output buffer by providing each transmission gate with its own inductor. The number of supplemental voltage supply pads needed to provide pull-up and pull-down operation can also be reduced by a factor of two (2), relative to the device of FIG. 6. Based on this embodiment, the RLC circuit formed at the first output OUT1 during the first portion of the pull-up time interval and the first portion of the pull-down time interval is equivalent to $(R_{TG341})(L_{341})(C_{L1})$ and $(R_{TG561})(L_{561})(C_{L1})$, respectively. Likewise, the RLC circuit formed at the second output OUT2 during the first portion of the pull-up time interval and the first portion of the pull-down time interval is equivalent to $(R_{TG342})(L_{342})(C_{L2})$ and $(R_{TG562})(L_{562})(C_{L2})$, respectively. The RLC circuit formed at the third output OUT3 during the first portion of the pull-up time interval and the first portion of the pull-down time interval is equivalent to $(R_{TG343})(L_{343})(C_{L3})$ and ($R_{TG563}$)($L_{563}$)($C_{L3}$), respectively. The RLC circuit formed at the fourth output OUT4 during the first portion of the pull-up time interval and the first portion of the pull-down time interval is equivalent to ($R_{TG344}$)($L_{344}$)($C_{L4}$) and ($R_{TG564}$)($L_{564}$)($C_{L4}$), respectively. An exemplary method of forming on-chip inductors is more fully described in an article by Ya-Hong Xie et al. entitled "An Approach for Fabricating High-Performance Inductors on Low-Resistivity Substrates", IEEE Journal of Solid-State Circutis, Vol. 33, No. 9, pp. 1433–1438, September (1998), the disclosure of which is hereby incorporated herein by reference.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit, comprising:

an integrated circuit substrate;

a first output buffer in said substrate, said first output buffer including a first output, a first transistor electrically coupled in series between the first output and a first reference voltage and a second transistor electrically coupled in series between the first output and a second reference voltage;

first and second capacitors electrically coupled in series between the first and second reference voltages and together at an intermediate reference node;

a first switch having an input electrically coupled to the first output and an output electrically coupled to the intermediate reference node;

a second switch having an input electrically coupled to the first output and an output electrically coupled to the intermediate reference node;

a first inductor electrically coupled in series between the output of said first switch and the intermediate reference node; and a second inductor electrically coupled in series between the output of said second switch and the intermediate reference node.

2. The circuit of claim 1, wherein said first and second switches comprise CMOS transmission gates.

3. An integrated circuit, comprising:

an integrated circuit substrate;

a first output buffer in said substrate, said first output buffer including a first output, a first transistor electrically coupled in series between the first output and a first reference voltage and a second transistor electrically coupled in series between the first output and a second reference voltage;

first and second capacitors electrically coupled in series between the first and second reference voltages and together at an intermediate reference node;

a first switch having an input electrically coupled to the first output and an output electrically coupled to the intermediate reference node;

a second switch having an input electrically coupled to the first output and an output electrically coupled to the intermediate reference node;

first and second supplemental voltage supply pads that are electrically coupled to the outputs of said first and second switches, respectively;

a first inductor electrically coupled in series between the first supplemental voltage supply pad and the intermediate reference node; and a second inductor electrically coupled in series between the second supplemental voltage supply pad and the intermediate reference node;

wherein the intermediate reference node is electrically coupled to the first and second supplemental voltage supply pads; and wherein said first and second capacitors are located external to said integrated circuit substrate.

4. The circuit of claim 3, further comprising:

a second output buffer in said substrate, said second output buffer including a second output, a third transistor electrically coupled in series between the second output and the first reference voltage and a fourth transistor electrically coupled in series between the second output and the second reference voltage;

a third switch having an input electrically coupled to the second output and an output electrically coupled to the first supplemental voltage supply pad; and a fourth switch having an input electrically coupled to the second output and an output electrically coupled to the second supplemental voltage supply pad.

5. The circuit of claim 3, wherein said first and second switches comprise CMOS transmission gates.

6. An integrated circuit, comprising:

an integrated circuit substrate;

a first output buffer in said substrate, said first output buffer including a first output, a first transistor electrically coupled in series between the first output and a first reference voltage and a second transistor electrically coupled in series between the first output and a second reference voltage;

first and second capacitors electrically coupled in series between the first and second reference voltages and together at an intermediate reference node; and a first switch having an input electrically coupled to the first output and an output electrically coupled to the intermediate reference node a first supplemental voltage supply pad that is electrically coupled to the output of said first switch;

a second output buffer in said substrate, said second output buffer including a second output, a third transistor electrically coupled in series between the second output and the first reference voltage and a fourth transistor electrically coupled in series between the second output and the second reference voltage; and a second switch having an input electrically coupled to the second output and an output electrically coupled to the first supplemental voltage supply pad.

7. An integrated circuit, comprising:

an integrated circuit substrate;

a plurality of output buffers in said substrate a first supplemental voltage supply pad on said substrate;

a plurality of first switches, each of said first switches electrically coupled in series between an output of a respective one of said plurality of output buffers and said first supplemental voltage supply pad; and at least one capacitor having a first electrode electrically coupled to said first supplemental voltage supply pad and a second electrode electrically coupled to a reference signal line.

8. The circuit of claim 7, further comprising a first inductor electrically connected in series between the first electrode of said at least one capacitor and said first supplemental voltage supply pad.

9. The circuit of claim 7, further comprising:
a second supplemental voltage supply pad on said substrate; and
a plurality of second switches, each of said second switches electrically coupled in series between an output of a respective one of said plurality of output buffers and said second supplemental voltage supply pad.

10. The circuit of claim 9, further comprising:
a first inductor electrically connected in series between the first electrode of said at least one capacitor and said first supplemental voltage supply pad; and
a second inductor electrically connected in series between the first electrode of said at least one capacitor and said second supplemental voltage supply pad.

11. The circuit of claim 10, wherein said at least one capacitor comprises:
a first capacitor having a first electrode electrically connected to said first and second inductors and a second electrode electrically coupled to a ground signal line; and
a second capacitor having a first electrode electrically connected to said first and second inductors and a second electrode electrically coupled to a power supply signal line.

12. In an integrated circuit comprising an output buffer, a first supplemental voltage supply pad, a first switch electrically connected in series between an output of the output buffer and the first supplemental voltage supply pad, a capacitive load electrically connected to the output, and at least one external storage capacitor electrically coupled to the first supplemental voltage supply pad, a method of driving the capacitive load comprising the steps of:
driving the capacitive load from a ground reference voltage towards a first intermediate voltage by transferring first charge from the at least one external storage capacitor to the capacitive load during a first portion of a pull-up time interval;
driving the capacitive load from the first intermediate voltage towards a power supply voltage by transferring second charge from the output buffer to the capacitive load during a second portion of the pull-up time interval;
driving the capacitive load from the power supply voltage towards a second intermediate voltage by recycling at least portions of the first and second charge from the capacitive load back to the at least one external storage capacitor during a first portion of a pull-down time interval; and
driving the capacitive load from the second intermediate voltage towards the ground reference voltage by transferring charge from the capacitive load to the output buffer during a second portion of the pull-down time interval;
wherein said step of driving the capacitive load from a ground reference voltage towards a first intermediate voltage comprises the steps of:
turning on the first switch; and
disposing the output buffer in a high impedance state;
wherein said step of driving the capacitive load from the first intermediate voltage towards a power supply voltage comprises the step of turning off the first switch;
wherein said step of driving the capacitive load from the power supply voltage towards a second intermediate voltage comprises the steps of:
turning on the first switch; and
disposing the output buffer in a high impedance state;
wherein said step of driving the capacitive load from the second intermediate voltage towards the ground reference voltage comprises the step of turning off the first switch;
wherein the output buffer comprises a PMOS pull-up transistor that is electrically coupled in series between the output and the power supply voltage and has a gate electrode that is not electrically connected to the at least one external storage capacitor and an NMOS pull-down transistor that is electrically coupled in series between the output and the ground reference voltage and has a gate electrode that is not electrically connected to the at least one external storage capacitor;
wherein said step of driving the capacitive load from the first intermediate voltage towards a power supply voltage comprises turning on the PMOS pull-up transistor; and
wherein said step of driving the capacitive load from the second intermediate voltage towards the ground reference voltage comprises turning on the NMOS pull-down transistor.

13. In an integrated circuit comprising an output buffer, first and second supplemental voltage supply pads, a first switch electrically connected in series between an output of the output buffer and the first supplemental voltage supply pad, a second switch electrically connected in series between the output and the second supplemental voltage supply pad, a load electrically connected to the output, first and second external storage capacitors electrically connected in series between first and second reference voltages and together at an intermediate reference node, a first inductor electrically connected in series between the intermediate reference node and the first supplemental voltage supply pad and a second inductor electrically connected in series between the intermediate reference node and the second supplemental voltage supply pad, a method of driving the load comprising the steps of:
driving the load from a ground reference voltage towards a first intermediate voltage by transferring charge from the intermediate reference node through the first switch and to the load during a first portion of a pull-up time interval;
driving the load from the first intermediate voltage towards a power supply voltage by transferring charge from the output buffer to the load during a second portion of the pull-up time interval;
driving the load from the power supply voltage towards a second intermediate voltage by transferring charge from the load through the second switch and to the intermediate reference node during a first portion of a pull-down time interval; and
driving the load from the second intermediate voltage towards the ground reference voltage by transferring charge from the load to the output buffer during a second portion of the pull-down time interval.

14. The method of claim 13,
wherein said step of driving the load from a ground reference voltage towards a first intermediate voltage comprises the steps of:
turning on the first switch; and
disposing the output buffer in a high impedance state; and
wherein said step of driving the load from the first intermediate voltage towards a power supply voltage comprises the step of turning off the first switch.

15. The method of claim 14,
wherein said step of driving the load from the power supply voltage towards a second intermediate voltage comprises the steps of:
turning on the second switch; and
disposing the output buffer in a high impedance state; and
wherein said step of driving the load from the second intermediate voltage towards the ground reference voltage comprises the step of turning off the second switch.

16. The method of claim 15, wherein the output buffer comprises a PMOS pull-up transistor electrically coupled in series between the output and the power supply voltage and an NMOS pull-down transistor electrically coupled in series between the output and the ground reference voltage; wherein said step of driving the load from the first intermediate voltage towards a power supply voltage comprises turning on the PMOS pull-up transistor; and wherein said step of driving the load from the second intermediate voltage towards the ground reference voltage comprises turning on the NMOS pull-down transistor.

17. The method of claim 15, wherein said step of driving the load from a ground reference voltage towards a first intermediate voltage comprises maintaining the second switch in a non-passing state; and wherein said step of driving the load from the power supply voltage towards a second intermediate voltage comprises maintaining the first switch in a non-passing state.

18. In an integrated circuit comprising an output buffer, first and second supplemental voltage supply pads, a first switch electrically connected in series between an output of the output buffer and the first supplemental voltage supply pad, a second switch electrically connected in series between the output and the second supplemental voltage supply pad, a load electrically connected to the output, first and second external storage capacitors electrically connected in series between first and second reference voltages and together at an intermediate reference node, a first inductor electrically connected in series between the intermediate reference node and the first supplemental voltage supply pad and a second inductor electrically connected in series between the intermediate reference node and the second supplemental voltage supply pad, a method of driving the load comprising the steps of:
driving the load from a ground reference voltage towards a first intermediate voltage by transferring a first quantity of charge from the intermediate reference node through the first switch and to the load during a first portion of a pull-up time interval;
driving the load from the first intermediate voltage towards a power supply voltage by transferring charge from the output buffer to the load during a second portion of the pull-up time interval, in response to detecting when a slope of a voltage waveform across the load is at or approaching zero during the first portion of the pull-up time interval;
driving the load from the power supply voltage towards a second intermediate voltage by transferring charge from the load through the second switch and to the intermediate reference node during a first portion of a pull-down time interval; and
driving the load from the second intermediate voltage towards the ground reference voltage by transferring charge from the load to the output buffer during a second portion of the pull-down time interval, in response to detecting when a slope of a voltage waveform across the load is at or approaching zero during the first portion of the pull-down time interval.

19. The method of claim 18,
wherein said step of driving the load from a ground reference voltage towards a first intermediate voltage comprises the steps of:
turning on the first switch; and
disposing the output buffer in a high impedance state; and
wherein said step of driving the load from the first intermediate voltage towards a power supply voltage comprises the step of turning off the first switch.

20. The method of claim 19,
wherein said step of driving the load from the power supply voltage towards a second intermediate voltage comprises the steps of:
turning on the second switch; and
disposing the output buffer in a high impedance state; and
wherein said step of driving the load from the second intermediate voltage towards the ground reference voltage comprises the step of turning off the second switch.

21. The method of claim 20, wherein the output buffer comprises a PMOS pull-up transistor electrically coupled in series between the output and the power supply voltage and an NMOS pull-down transistor electrically coupled in series between the output and the ground reference voltage; wherein said step of driving the load from the first intermediate voltage towards a power supply voltage comprises turning on the PMOS pull-up transistor; and wherein said step of driving the load from the second intermediate voltage towards the ground reference voltage comprises turning on the NMOS pull-down transistor.

22. The method of claim 20, wherein said step of driving the load from a ground reference voltage towards a first intermediate voltage comprises maintaining the second switch in a non-passing state; and wherein said step of driving the load from the power supply voltage towards a second intermediate voltage comprises maintaining the first switch in a non-passing state.

23. In an integrated circuit comprising an output buffer, an supplemental voltage supply pad, a switch electrically connected in series between an output of the output buffer and the supplemental voltage supply pad, a load electrically connected to the output, an external storage capacitor, an external inductor electrically connected between the external capacitor and the supplemental voltage supply pad, a method of driving the load comprising the steps of:
driving the load from a ground reference voltage towards a first intermediate voltage by transferring a first quantity of charge from the external capacitor through the inductor and switch and to the load during a first portion of a pull-up time interval; and
driving the load from the first intermediate voltage towards a power supply voltage by transferring charge from the output buffer to the load during a second portion of the pull-up time interval, in response to detecting when a slope of a voltage waveform across the load is at or approaching zero during the first portion of the pull-up time interval.

24. The method of claim 23,
wherein said step of driving the load from a ground reference voltage towards a first intermediate voltage comprises the steps of:
turning on the switch; and
disposing the output buffer in a high impedance state; and wherein said step of driving the load from the first intermediate voltage towards a power supply voltage comprises the step of turning off the switch.

25. In an integrated circuit comprising an output buffer, first and second supplemental voltage supply pads, a first switch electrically connected in series between an output of the output buffer and the first supplemental voltage supply pad, a second switch electrically connected in series between the output and the second supplemental voltage supply pad, a load electrically connected to the output, an external storage capacitor, a first external inductor electrically connected between the external storage capacitor and the first supplemental voltage supply pad and a second external inductor electrically connected between the external storage capacitor and the second supplemental voltage supply pad, a method of driving the load comprising the steps of:

driving the load from a ground reference voltage towards a first intermediate voltage by transferring a first quantity of charge from the external capacitor through the first switch and to the load during a first portion of a pull-up time interval;

driving the load from the first intermediate voltage towards a power supply voltage by transferring charge from the output buffer to the load during a second portion of the pull-up time interval, in response to detecting when a slope of a voltage waveform across the load is at or approaching zero during the first portion of the pull-up time interval;

driving the load from the power supply voltage towards a second intermediate voltage by transferring charge from the load through the second switch and to the external capacitor during a first portion of a pull-down time interval; and driving the load from the second intermediate voltage towards the ground reference voltage by transferring charge from the load to the output buffer during a second portion of the pull-down time interval, in response to detecting when a slope of a voltage waveform across the load is at or approaching zero during the first portion of the pull-down time interval.

26. The method of claim 25,
wherein said step of driving the load from a ground reference voltage towards a first intermediate voltage comprises the steps of:
turning on the first switch; and
disposing the output buffer in a high impedance state; and
wherein said step of driving the load from the first intermediate voltage towards a power supply voltage comprises the step of turning off the first switch.

27. The method of claim 26,
wherein said step of driving the load from the power supply voltage towards a second intermediate voltage comprises the steps of:
turning on the second switch; and
disposing the output buffer in a high impedance state; and
wherein said step of driving the load from the second intermediate voltage towards the ground reference voltage comprises the step of turning off the second switch.

28. The method of claim 27, wherein the output buffer comprises a PMOS pull-up transistor electrically coupled in series between the output and the power supply voltage and an NMOS pull-down transistor electrically coupled in series between the output and the ground reference voltage; wherein said step of driving the load from the first intermediate voltage towards a power supply voltage comprises turning on the PMOS pull-up transistor; and wherein said step of driving the load from the second intermediate voltage towards the ground reference voltage comprises turning on the NMOS pull-down transistor.

29. The method of claim 28, wherein said step of driving the load from a ground reference voltage towards a first intermediate voltage comprises maintaining the second switch in a non-passing state; and wherein said step of driving the load from the power supply voltage towards a second intermediate voltage comprises maintaining the first switch in a non-passing state.

30. In an integrated circuit comprising a semiconductor substrate, an output buffer having a pull-up transistor electrically coupled in series between an output node and a first reference voltage and a pull-down transistor electrically coupled in series between the output node and a second reference voltage, a supplemental voltage supply pad on the substrate, an external storage capacitor and an external inductor electrically connected between an electrode of the external capacitor and the supplemental voltage supply pad, a method of driving the output node comprising the steps of:

driving the output node with current from the external inductor during a first portion of a pull-up time interval; and driving the output node with current from the pull-up transistor during a second portion of the pull-up time interval.

31. The method of claim 30, wherein said step of driving the output node with current from the pull-up transistor comprises driving the output node with current from the pull-up transistor in response to detecting when a slope of a voltage waveform at the output node is at or approaching zero during the first portion of the pull-up time interval.

32. In an integrated circuit comprising an output buffer having a pull-up transistor electrically coupled in series between an output node and a first reference voltage, a pull-down transistor electrically coupled in series between the output node and a second reference voltage, a capacitive load electrically coupled to the output node, and at least one storage capacitor, a method of driving the output node comprising the steps of:

driving the output node from the second reference voltage towards a first intermediate voltage between the first and second reference voltages by transferring charge from the at least one storage capacitor to the capacitive load during a first portion of a pull-up time interval;

driving the output node from the first intermediate voltage towards the first reference voltage while the output node is electrically isolated from the at least one storage capacitor; and driving the output node from the first reference voltage towards a second intermediate voltage between the first and second reference voltages by recycling charge from the capacitive load back to the at least one storage capacitor during a first portion of a pull-down time interval; and wherein said step of driving the output node with displacement current from the storage capacitor comprises driving the output node with displacement current that passes from the storage capacitor and through an inductor to the output node.

33. In an integrated circuit comprising a pull-up transistor, which is electrically coupled in series between a first line having a first capacitance associated therewith and a power supply line, a pull-down transistor, which is electrically coupled in series between the first line and a reference line, and a charge recycling switch having an input electrically coupled to the first line and an output electrically coupled to a second line having a second capacitance associated therewith, a method of driving the first line through a complete pull-up and pull-down cycle, said method comprising the steps of:

driving the first line from a logic 0 voltage to a first intermediate voltage between the logic 0 voltage and a logic 1 voltage by transferring charge from the second line through the charge recycling switch and to the first line during a first portion of a pull-up time interval; then driving the first line from the first intermediate voltage to the logic 1 voltage by turning on the pull-up transistor and transferring charge from the power supply line to the first line, while the charge recycling switch is off and the first line is electrically disconnected from the second line; then driving the first line from the logic 1 voltage to a second intermediate voltage between the logic 1 voltage and the logic 0 voltage by recycling charge from the first line through the charge recycling switch and to second line; and then driving the first line from the second intermediate voltage to the logic 0 voltage by turning on the pull-down transistor and transferring charge from the first line to the reference line, while the charge recycling switch is off and the first line is electrically disconnected from the second line.

* * * * *